United States Patent
Mizuno et al.

(10) Patent No.: US 9,060,423 B2
(45) Date of Patent: Jun. 16, 2015

(54) LAMINATED WIRING BOARD

(75) Inventors: Satoshi Mizuno, Kanagawa (JP);
Masafumi Oyama, Kanagawa (JP);
Akira Arahata, Kanagawa (JP)

(73) Assignee: Sony Corporation, Tokyo (JP)

( * ) Notice: Subject to any disclaimer, the term of this patent is extended or adjusted under 35 U.S.C. 154(b) by 701 days.

(21) Appl. No.: 13/349,971

(22) Filed: Jan. 13, 2012

(65) Prior Publication Data

US 2012/0201087 A1   Aug. 9, 2012

(30) Foreign Application Priority Data

Feb. 7, 2011   (JP) .................................. 2011/023723

(51) Int. Cl.
*H05K 1/00* (2006.01)
*H05K 1/02* (2006.01)

(52) U.S. Cl.
CPC ............ *H05K 1/0218* (2013.01); *H05K 1/0228* (2013.01); *H05K 1/025* (2013.01); *H05K 2201/09327* (2013.01); *H05K 2201/09709* (2013.01); *H05K 2201/09727* (2013.01); *H05K 2201/10159* (2013.01)

(58) Field of Classification Search
None
See application file for complete search history.

(56) References Cited

U.S. PATENT DOCUMENTS

| | | | | |
|---|---|---|---|---|
| 5,003,273 A | * | 3/1991 | Oppenberg | 333/1 |
| 5,136,358 A | * | 8/1992 | Sakai et al. | 257/659 |
| 5,489,570 A | * | 2/1996 | Geach et al. | 504/261 |
| 7,237,587 B2 | * | 7/2007 | Kim | 174/255 |
| 2005/0067187 A1 | * | 3/2005 | Hsu | 174/255 |
| 2006/0028295 A1 | * | 2/2006 | Piernas | 333/116 |
| 2006/0192282 A1 | * | 8/2006 | Suwa et al. | 257/723 |
| 2008/0135278 A1 | * | 6/2008 | Abe | 174/250 |
| 2009/0173520 A1 | * | 7/2009 | Duong | 174/250 |

FOREIGN PATENT DOCUMENTS

| | | |
|---|---|---|
| JP | 2002-299840 | 10/2002 |
| JP | 2003-218541 | 7/2003 |
| JP | 2008-235364 | 10/2008 |

\* cited by examiner

*Primary Examiner* — Tuan T Dinh
*Assistant Examiner* — Steven T Sawyer
(74) *Attorney, Agent, or Firm* — Sony Corporation

(57) ABSTRACT

A laminated wiring board includes a plurality of wiring layers that are stacked with the intermediary of an insulating layer between the layers and have a four-layer wiring unit obtained by disposing a power supply layer, a ground layer, a first signal wiring layer, and a second signal wiring layer sequentially from one side to the other side of a layer stacking direction with the intermediary of an insulating layer between the layers. One of the first signal wiring layer and the second signal wiring layer includes a data signal line and the other includes a clock signal line. The data signal line and the clock signal line are so disposed as to be prevented from overlapping with each other in a view perpendicular to the layer stacking direction at least at a place where both lines are disposed as parallel lines.

7 Claims, 6 Drawing Sheets

| L1 | CLK·ADDR/CMD |
|---|---|
| L2 | DQS·DQ |
| L3 | GND |
| L4 | VDD1.8 |

| L1 | CLK·ADDR/CMD |
|---|---|
| L2 | GND |
| L3 | DQS·DQ |
| L4 | GND |
| L5 | VDD1.8 |
| L6 | SIG |

| L1 | CLK·ADDR/CMD |
|----|--------------|
| L2 | DQS·DQ |
| L3 | GND |
| L4 | VDD1.8 |
| L5 | GND |
| L6 | SIG |

| L1 | CLK·ADDR/CMD |
|----|--------------|
| L2 | GND |
| L3 | DQS·DQ |
| L4 | GND |
| L5 | VDD1.8 |
| L6 | SIG |
| L7 | GND |
| L8 | SIG |

US 9,060,423 B2

LAMINATED WIRING BOARD

BACKGROUND

The present disclosure relates to a laminated wiring board suitable for mounting of a semiconductor integrated circuit such as a double data rate (DDR)-synchronous DRAM (SDRAM).

A laminated wiring board is known in which at least one semiconductor device (integrated circuit (IC)) that operates by a high-speed clock signal is mounted together with other electronic parts such as a controller IC that controls the semiconductor device.

In particular, small size and high-density mounting are required for a (printed) wiring board mounted in portable electronic apparatus, and increase in the number of stacked layers is promoted in response to this request.

For example, in a multilayer motherboard mounted in small portable apparatus or a package board mounted on a motherboard as one kind of electronic parts, one laminated wiring board is realized by stacking wiring boards of four, six, eight, or more layers. Each wiring board is obtained by forming an electrically-conductive layer such as a copper foil on a substrate or a tape (insulating layer) of e.g. a resin. Wiring is formed by patterning the electrically-conductive layer. Conduction between the wiring layers is realized by a through-via or another technique. There are a technique in which through-vias are mechanically formed and conduction between wiring layers is established by e.g. copper plating, and a technique in which conductive measures are provided in each layer and conduction between wiring layers is established when the layers are built up.

Such a laminated wiring board has a multilayer structure obtained by stacking plural wiring layers with the intermediary of an electrically-conductive layer between the layers.

In the laminated wiring board, layers are provided such as a power supply layer in which a power supply pattern as a pattern connected to a power supply is provided and a ground layer in which a ground pattern as a pattern connected to the ground is provided. Furthermore, for example, in a laminated wiring board composed of six layers, one power supply layer and one or two ground layers are provided as inner layers, i.e. layers existing inside the laminated wiring board, in many cases. Normally a signal wiring layer in which a pattern of a signal line is provided is so disposed as to be stacked adjacent to the ground layer with the intermediary of an insulating layer.

For size reduction (reduction in the occupation area and the thickness), these wiring layers are mounted at high density to form the laminated wiring board.

Therefore, in the laminated wiring board for mounting a high-speed operation IC, there is a problem that the distance of the signal wiring layer from the power supply layer is long particularly. For example, in the case of the DDR-SDRAM, it is difficult to dispose the signal wiring layer in which a pattern of signal wiring driven at the DDR (double data rate) is provided as an inner layer across a sufficiently-short distance from the power supply layer or an outer layer closer to the outside, because of high-density mounting. Furthermore, due to increase in the distance between the power supply layer and the ground layer, the capacitive coupling and inductive coupling of the power supply section become small. Therefore, the impedance of the path to supply the power supply voltage and the ground potential to the circuit that treats a high-speed signal becomes high.

Due to this impedance increase, in a laminated wiring board such as a DDR memory interface board, simultaneous switching noise (SSO) and so forth of a high-speed operation LSI is readily superimposed on the power supply and the ground. As a result, temporal variation (jitter) or inter-signal interference (crosstalk) of signal potential transition becomes larger and the lowering of the characteristics of the LSI occurs.

To suppress the impedance increase of the power supply wiring and the ground wiring, several laminated wiring board structures have been proposed regarding the arrangement of wiring layers (refer to the following Patent Documents 1 to 3).

In Patent Document 1 (Japanese Patent Laid-open No. 2002-299840), a laminated wiring board in which seven layers that are composed of wiring layers and insulating layers and are represented by symbols L1 to L7 are provided is disclosed (see FIG. 1 and so forth of cited document 1). For example, in FIG. 1 of cited document 1, the lowermost layer is L7. As the reference number of the symbol "L" becomes larger, a larger number of layers are stacked on the upper side of this layer. The uppermost layer is L1. A wiring layer is formed also on the back surface of the lowermost layer L7.

In the wiring layer arrangement of Patent Document 1, a power supply layer to which a power supply voltage is supplied is employed as the fifth layer L5, and a ground layer is provided as the fourth layer L4, which is the upper adjacent layer. The second layer L2 and the seventh layer L7 are also ground layers. Signal line wiring layers are provided as the first layer L1, the third layer L3, and the sixth layer L6, which are adjacent to the ground layers.

According to such stacking arrangement of wiring layers, the ground layer is disposed as the fourth layer L4 adjacent to (on the upper side of) the fifth layer L5, which is the power supply layer, and thereby the capacitive coupling and the inductive coupling between both wiring layers are made large. Thus, the impedance of each wiring layer becomes low and potential variation due to noise and so forth occurs less readily in both wiring layers.

In Patent Document 2 (Japanese Patent Laid-open No. 2003-218541), a structure in which a power supply layer 14 is sandwiched by ground layers 13a and 13b from both sides is disclosed (refer to FIG. 1 of cited document 2). Thus, in the power supply layer and the ground layer, the resistance against noise due to reduction in the impedance is higher compared with that in the above-described cited document 1.

In Patent Document 3 (Japanese Patent Laid-open No. 2008-235364), the assignee of the present application has already proposed a laminated wiring board structure in which two power supply layers L3 and L4 are disposed with the intermediary of an insulating layer (see FIG. 2 of cited document 3). Two ground layers L2 and L5 are provided on both sides of the two power supply layers L3 and L4 with the intermediary of each insulating layer. Signal wiring layers are provided as the uppermost layer L1 and the lowermost layer L6.

SUMMARY

In the structure described in the above-described cited document 1, the ground layer is necessarily disposed adjacent to (on the upper side or lower side of) the signal wiring layer. Thus, the number of ground layers is large and reducing the thickness is difficult. Furthermore, the signal line connected to the LSI mounted on the surface is provided in plural layers that are greatly different in the depth (distance in the layer stacking direction), and therefore delay design and so forth is not easy.

In the structure described in the above-described cited document 3, normally the signal wiring driven at the DDR (double data rate) can be disposed only in one layer (layer L1) on the surface side. This readily causes the case in which the wiring area increases or wiring is difficult. Specifically, in the case of normal single-sided mounting, the lowermost layer L6 far from the surface can be used only for a low-speed signal line although a high-speed signal line can be disposed on the side of the uppermost layer L1 as the LSI-mounted side.

As just described, as the speed of the LSI becomes higher, it becomes technically difficult to reduce the number of layers and the board area at the same time while keeping the characteristics within the DDR standard (JEDEC) in a high-density board, by the techniques described in the above-described cited documents.

In the above-described cited document 2, a structure for surrounding the power supply line, including the board end surface, by the ground layers as countermeasures against radioactive electromagnetic interference (EMI) is described and the arrangement structure of a high-speed signal line is not considered.

There is provided a technique to propose a multilayer wiring structure capable of reducing the number of layers and the board area at the same time while keeping the characteristics of a mounted high-speed LSI and the whole module within the standard, to thereby resolve disadvantages of the above-described related arts.

The present disclosure proposes a laminated wiring board structure in which two signal wiring layers are stacked and particularly the wiring arrangement of clock and data is optimized in this stacking to thereby allow achievement of suppression of signal crosstalk between the lines and increase in the impedance of power supply line and ground line.

According to one embodiment of the present disclosure, there is provided a laminated wiring board including a plurality of wiring layers configured to be stacked with the intermediary of an insulating layer between the layers and have a four-layer wiring unit obtained by disposing a power supply layer to which a power supply voltage is supplied, a ground layer to which a ground potential is supplied, a first signal wiring layer, and a second signal wiring layer sequentially from one side of a layer stacking direction to the other side of the layer stacking direction with the intermediary of an insulating layer between the layers. One of the first signal wiring layer and the second signal wiring layer includes a data signal line and the other of the first signal wiring layer and the second signal wiring layer includes a clock signal line. The data signal line and the clock signal line are so disposed as to be prevented from overlapping with each other in a view perpendicular to the layer stacking direction at least at a place where both lines are disposed as parallel lines.

According to the above-described configuration, the ground layer and the power supply layer are adjacent to each other with the intermediary of the insulating layer between the layers. Thus, both wiring layers have high resistance against noise due to reduction in the impedance.

Furthermore, the distance from the second signal wiring layer to the ground layer is longer than that from the first signal wiring layer to the ground layer, and the first signal wiring layer is disposed between the second signal wiring layer and the ground layer. One of the first signal wiring layer and the second signal wiring layer includes the data signal line and the other includes the clock signal line. In one embodiment of the present disclosure, the first signal wiring layer and the second signal wiring layer are formed in such a manner that the data signal line and the clock signal line do not overlap with each other in the view perpendicular to the layer stacking direction at a place where both lines are disposed as parallel lines. Thus, for example, by setting the wiring width of the second signal wiring layer larger than that of the first signal wiring layer depending on e.g. the difference in the distance, it becomes easy to design the structure in such a manner that the capacitive coupling and inductive coupling of the first and second signal wiring layers to the ground layer are equalized to a higher extent or each have the desired coupling force. Furthermore, crosstalk between the first and second signal wiring layers is also suppressed. Moreover, two layers can be ensured as the signal wiring layers although the number of each of power supply layers and ground layers is one. Therefore, with satisfaction of the high-speed device standard, reduction in the thickness of the multilayer wiring structure itself and reduction in the area by ensuring of the wiring space can be achieved.

The embodiment of the present disclosure can realize a multilayer wiring structure capable of reducing the number of layers and the board area at the same time while keeping the characteristics of a mounted high-speed LSI and the whole module within the standard.

BRIEF DESCRIPTION OF THE DRAWINGS

FIG. 1 is a schematic wiring structure diagram of a laminated wiring board relating to a first embodiment of the present disclosure;

FIG. 2 is a schematic wiring structure diagram of a laminated wiring board relating to a comparative example (first comparative example) of the first embodiment;

FIG. 3 is a schematic wiring structure diagram of a laminated wiring board relating to a second embodiment of the present disclosure;

FIG. 4 is a schematic wiring structure diagram of a laminated wiring board relating to a comparative example (second comparative example) of the second embodiment.

DETAILED DESCRIPTION OF THE PREFERRED EMBODIMENTS

Figure 5:
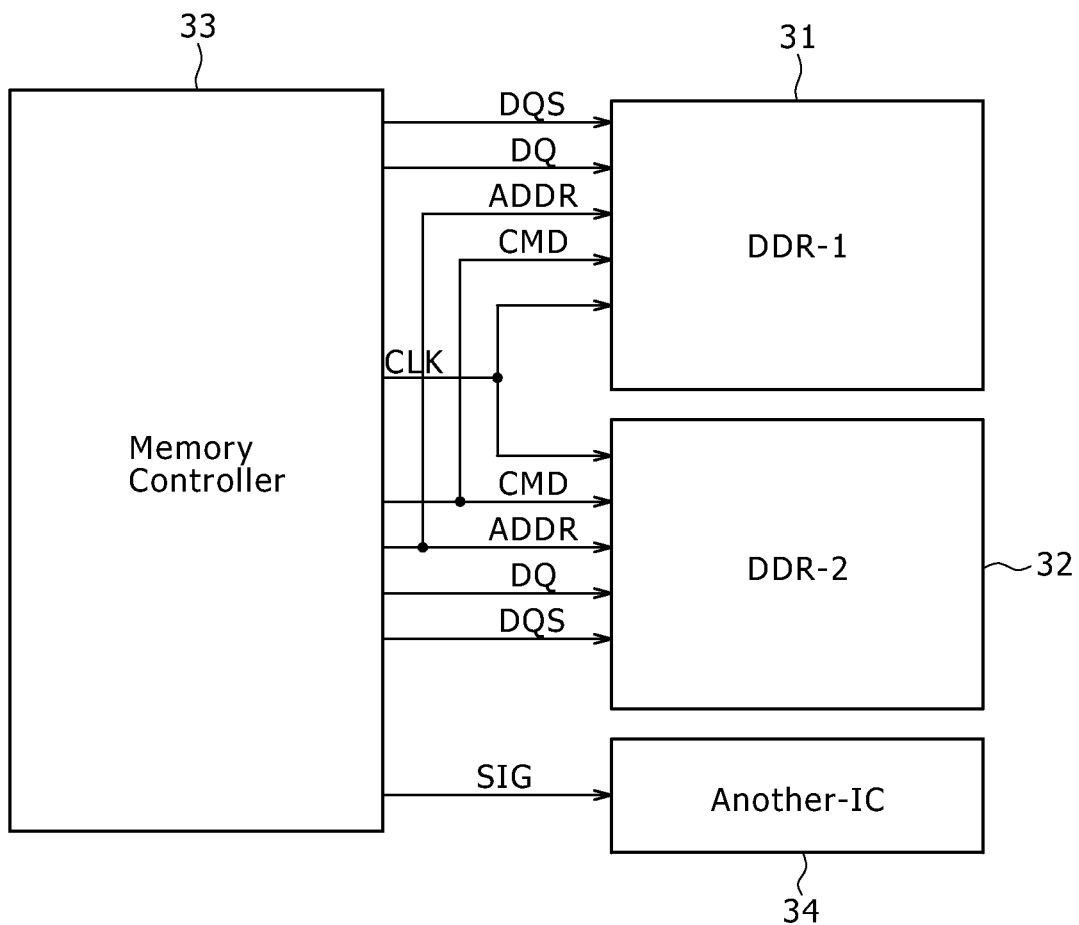
FIG. 5 is a circuit block diagram of a memory module relating to a third embodiment of the present disclosure.

Embodiments of the present technique will be described below in the following order with reference to the drawings by taking a DDR-SDRAM mounted board as an example.

The laminated wiring board to which one embodiment of the present technique is applied may be a module board in which a DDR-SDRAM is modularized together with other electronic parts. Alternatively, one embodiment of the present technique may be applied also to a package board in which a DDR-SDRAM is packaged and a motherboard in which a DDR-SDRAM is mounted together with a controller and so forth. Although the device is not limited to the DDR- SDRAM, it is preferable for one embodiment of the present technique to be applied to a device used with many high-speed signal lines disposed at high density, such as a DDR-SDRAM. Examples of other devices include mounting of a CPU with plural cores and an IC card involving strong needs for reduction in the size and the thickness.

The rough order of the description is as follows.
1. First Embodiment
  embodiment of four-layer wiring unit composed of first and second signal wiring layers, ground layer, and power supply layer
2. Second Embodiment
  embodiment of five-layer wiring structure obtained by adding second ground layer and third signal wiring layer to four-layer wiring unit
3. Third Embodiment
  embodiment showing requirements regarding overlap of signal lines when second embodiment is applied to DDR-SDRAM <1. First Embodiment>
[Wiring Layer Structure]

FIG. 1 is a schematic wiring structure diagram of a laminated wiring board relating to the present embodiment. Although FIG. 1 shows only four wiring layers, insulating layers (not shown) intervene among the respective wiring layers.

As shown in FIG. 1, this laminated wiring board 1 is composed of four wiring layers represented by symbols L1, L2, L3, and L4 from the upper layer side and three insulating layers (not shown) among the respective layers, and this structure corresponds to the "four-layer wiring unit."

Specifically, from the uppermost layer, a second signal wiring layer L1, a first signal wiring layer L2, a ground layer L3, and a power supply layer L4 are stacked.

The lowermost power supply layer L4 is a wiring layer including a power supply line pattern to which a power supply voltage VDD of e.g. 1.8 V is supplied.

The ground layer L3 thereon is a wiring layer including a grounded pattern kept at a ground potential GND.

The first signal wiring layer L2 is a wiring layer including a data signal line. For example, in the case of the DDR-SDRAM to be described later, the data signal line corresponds to wiring to transmit a data signal (DQ).

The uppermost second signal wiring layer L1 is a wiring layer including a pattern of a clock signal line to transmit a clock signal (CLK).

In FIG. 1, the names of the signals used in the DDR-SDRAM are also shown in order to facilitate understanding in comparison with the embodiment of the DDR-SDRAM to be described later. However, the present embodiment is not an embodiment that can be applied only to the DDR-SDRAM as described above. The "four-layer wiring unit" shown in FIG. 1 can be widely applied also to laminated wiring boards of a device in which a high-speed signal line should be disposed in two layers, other than the DDR-SDRAM.

A connecting part (not shown) such as a through-via is appropriately provided in the insulating layers (not shown) among the respective wiring layers. If another wiring layer intervenes between two wiring layers that are the connection subjects of the connecting part, this wiring layer is so disposed as to avoid the connecting part for preventing short-circuiting. The ground layer L3 and the power supply layer L4 do not necessarily have to be a wiring pattern. They may be formed as an electrically-conductive layer having a large area or may be formed based on the combination of an electrically-conductive layer having a large area and a wiring pattern. If the electrically-conductive layer is vertically penetrated to permit the passage of the connecting part, e.g. a structure is employed in which an aperture is provided in the electrically-conductive layer in order to avoid electrical short-circuiting and a connecting part such as a through-via passes in this aperture.

The surface side of the second signal wiring layer L1 is the mounting surface of a device (semiconductor integrated circuit). The second signal wiring layer L1 is provided on the mounting surface side of the device and the first signal wiring layer L2 is provided as the layer immediately under the second signal wiring layer L1. Thus, there is an advantage that wiring to transmit the high-speed clock signal (CLK) and the high-speed data signal (e.g. DQ) input/output to/from the device is easily connected to the device and delay design and so forth is accurately carried out.

Although the wiring of the clock signal (CLK) is provided in the second signal wiring layer L1 on the mounting surface side and the wiring of the data signal is provided in the first signal wiring layer L2 under the second signal wiring layer L1, the inverse structure may be employed. That is, the clock signal (CLK) may be allocated to the first signal wiring layer L2 and the data signal may be allocated to the second signal wiring layer L1.

It is also possible to expand this four-layer wiring unit to double-sided mounting.

Specifically, it is also possible to employ a seven-layer wiring structure obtained by treating the power supply layer L4 as the center inner layer of the laminated wiring board and folding back the respective layers of symbols L3, L2, and L1 shown in FIG. 1 to the lower side with respect to the power supply layer L4 as the center. In this case, a structure of total eight layers may be employed by disposing two power supply layers L4 adjacent to each other with the intermediary of a thin insulating layer between the layers. This enables mounting of a high-speed device on both the front surface and the back surface.

If the number of signal wiring layers on the back surface side is one, the structure is similar to that of the next second embodiment and therefore description thereof will be made later.

As a semiconductor device mounted on a single side or double sides, a semiconductor chip may be mounted in a bare state or may be mounted in a package state. The bare mounting and the package mounting may be mixed. Normally, in the case of the motherboard, mounting of a packaged device is mainly employed. However, if needs for reduction in the size and thickness of e.g. an IC card are strong, a bare chip is directly mounted on the motherboard with the intermediary of terminals such as surface-disposed bumps or a chip is mounted on the motherboard with the intermediary of a chip-size substrate called an interposer. The "motherboard" refers to the main board of this electronic apparatus.

As a small board (package board or module board) mounted on a motherboard, the laminated wiring board of the present embodiment in which plural semiconductor devices are mounted can be used. Also in this case, the semiconductor devices can be mounted whether chip mounting or package mounting is employed, and the number of devices is also arbitrary. However, providing two signal wiring layers like the present embodiment is suitable for the case of mounting plural LSIs having multiple pins. Furthermore, requirements of arrangement of wiring, to be described next, are suitable for the case in which wiring driven at a comparatively-high frequency is mounted at high density.

[Requirement of Signal Line Arrangement]

A requirement of the present embodiment is as follows. The pattern of the high-speed signal line included in the first signal wiring layer L2 and the pattern of the high-speed signal line included in the second signal wiring layer L1 are so disposed that overlap of both signal lines in the view perpendicular to the layer stacking direction is avoided as much as possible at least at a place where both signal lines are disposed as parallel lines.

At a place where the high-speed signal lines (clock signal line and data signal line) included in two wiring layers intersect with each other, the capacitive and inductive coupling is local. However, the strength of the coupling is relatively high at the place of the parallel arrangement. This is one of major factors in characteristic variation. Therefore, in the present embodiment, the above-described requirement is imposed on the parallel arrangement place to thereby suppress crosstalk between high-speed signals as much as possible.

Each of the high-speed signal lines is coupled to the ground layer L3 under the high-speed signal lines capacitively and inductively. The coupling state varies at this coupling place if another signal line is disposed in the coupling path and its potential varies. This is a factor in noise. Therefore, in the present embodiment, it is the most desirable that these two high-speed signal lines (clock signal line and data signal line) do not overlap with each other at a parallel line place from the viewpoint of the mounting surface. However, local wiring overlap from the viewpoint of the mounting surface is permitted at e.g. a partial place with a bypass for avoiding the connecting part. Furthermore, although depending on the operating frequency, partial overlap is also permitted as long as there is no problem in terms of the characteristics even if part of the line width overlaps.

Also in signal line combinations other than the combination of the clock signal line and the data line, it is desirable that overlap of the signal lines is avoided as much as possible at a parallel line place because the signal lines involve potential variation irrespective of the kinds of the signal lines.

The arrangement relationship between the clock signal line or the data line and another signal line and the arrangement relationship between other signal lines will be described in the next second embodiment by taking specific signal line names. Therefore, description thereof is omitted here.

[Requirement of Signal Line Width]

It is desirable to impose a requirement also on the signal line width, in addition to the above-described requirement of the signal line arrangement.

The requirement is that "the width of the signal line remoter from the ground layer L3 is set larger than that of the signal line closer to the ground layer L3 regarding two signal lines that are prevented from overlapping with each other in the view perpendicular to the layer stacking direction as much as possible and are provided in two adjacent layers."

In accordance with this requirement, if the second signal wiring layer L1 has the clock signal (CLK) line and the first signal wiring layer L2 has the data line as shown in FIG. 1, the width of the clock signal (CLK) line is set larger than that of the data signal line (e.g. DQ line).

This width difference may be decided depending on the difference in the distance from the ground layer L3, for example. Alternatively, the width may be so set that the impedance value of each wiring layer falls within the individually-decided optimum range. For example, in the case of the DDR-SDRAM to be described later, the width of the clock signal (CLK) line of the first signal wiring layer L2 is so set that its impedance falls within the range from 50Ω to 70Ω.

[First Comparative Example]

FIG. 2 shows a first comparative example in which a ground layer is provided adjacent to each high-speed signal line layer.

In a laminated wiring board 1A shown in FIG. 2, a fifth layer L5 is a power supply layer and a ground layer coupled to the power supply layer is provided as a fourth layer L4. Furthermore, based on the design concept in which a ground layer is necessarily provided adjacent to the high-speed signal wiring layer, a ground layer L2 is disposed next to a second signal wiring layer L1 including wiring of the clock signal (CLK). Based on the same design concept, a first signal wiring layer L3 including wiring of the data signal (e.g. DQ signal) is disposed as the next layer (third top layer) and the ground layer L4 is disposed as the fourth top layer immediately under the first signal wiring layer L3.

If a signal line is added for a low-speed signal, this signal line is provided in a sixth layer L6 as shown in the diagram.

When FIG. 2 is compared with FIG. 1, even if the lowermost signal wiring layer L6 for a low-speed signal is not considered, the number of ground layers is larger by one in FIG. 2 and correspondingly reduction in the thickness is inhibited.

According to the present embodiment, if the requirement of the signal line arrangement is satisfied in the above-described configuration, crosstalk between signals is suppressed although the number of layers is the minimum, i.e. four, and signal line layers are allocated to two layers. Furthermore, even when plural semiconductor integrated circuits simultaneously perform wiring potential transition (signal switch), such as output, noise is rapidly removed and the desired characteristics are obtained because the impedance of the power supply line and the ground line is low. Moreover, two signal line layers are provided and are outer layers on the mounting surface side. Thus, high-speed signal lines can be mounted at high density. As a result, it becomes possible to realize the following excellent small laminated wiring board. Specifically, this laminated wiring board has the minimum four-layer structure and small thickness. In addition, it allows reduction in the area of the laminated wiring board and does not inhibit the high-speed performance of the LSI.

<2. Second Embodiment>

FIG. 3 shows a schematic wiring structure diagram of a laminated wiring board relating to the second embodiment. Although FIG. 3 shows only six wiring layers, insulating layers (not shown) intervene among the respective wiring layers.

As shown in FIG. 3, this laminated wiring board 2 includes four wiring layers represented by symbols L1, L2, L3, and L4 from the upper layer side and three insulating layers (not shown) among the respective layers, and this structure corresponds to the "four-layer wiring unit."

Specifically, from the uppermost layer, a second signal wiring layer L1, a first signal wiring layer L2, a ground layer L3, and a power supply layer L4 are stacked.

The above-described configuration is the same as that of the above-described first embodiment, and the above-described "requirement of the signal line arrangement" and the addable "requirement of the signal line width" can be applied to this configuration. Because the configuration about four layers L1 to L4 is the same as that of the first embodiment, description thereof is omitted here.

In the present embodiment, further two wiring layers are added.

As shown in FIG. 3, another ground layer L5 (second ground layer) is disposed immediately under the power supply layer L4. It is desirable that the thickness of the insulating layer (not shown) between the ground layer L5 and the power supply layer L4 is set as small as possible, similarly to the insulating layer between the ground layer L3 and the power supply layer L4. This strengthens the coupling between the power supply layer and the ground layer and can correspondingly lower the impedance.

Furthermore, a third signal wiring layer L6 is disposed under the ground layer L5 with the intermediary of an insulating layer (not shown). In the present embodiment, this third signal wiring layer L6 serves as the back surface wiring layer.

It is desirable that the wiring width of the third signal wiring layer L6 is also set larger than that of the first signal wiring layer L2 and the impedance is brought within the range from 50Ω to 70Ω.

In the above-described first embodiment, room for disposing the low-speed signal line is often absent if upper two layers are allocated to layers for the high-speed signal line. Even if there is room for disposing the low-speed signal line, when it is desirable to prevent the low-speed signal line from being affected by sudden, frequent potential transition of the high-speed signal line, the third signal wiring layer L6 may be provided on the back surface side and be used as the layer for the low-speed signal line like in the present embodiment. In this case, the ground layer L5 is provided adjacent to the third signal wiring layer L6 as the ground layer for it.

In the case of the low-speed signal line, the influence on its characteristics is small even when there is some increase in the impedance, i.e. there are connection resistance and connection inductance from the LSI and so forth on the surface side via a through-via. Thus, the low-speed signal line can be disposed on the back surface side remote from the mounting surface in this manner. In the case of double-sided mounting, IC, LSI, etc. using the low-speed signal line can be disposed on the back surface side. In any case, the high-speed signal line is allocated to an upper-side outer layer close to the main mounting surface, and the low-speed signal line is allocated to a lower-side outer layer remote from the main mounting surface.

[Second Comparative Example]

FIG. 4 shows a second comparative example in which a ground layer is provided adjacent to each high-speed signal line layer.

In a laminated wiring board 2A shown in FIG. 4, a fifth layer L5 is a power supply layer and a ground layer coupled to the power supply layer is provided as L4. Furthermore, based on the design concept in which a ground layer is necessarily provided adjacent to the high-speed signal wiring layer, a ground layer L2 is disposed next to a second signal wiring layer L1 including wiring of the clock signal (CLK). Based on the same design concept, a first signal wiring layer L3 including wiring of the data signal (e.g. DQ signal) is disposed as the next layer (third top layer) and the ground layer L4 is disposed as the fourth top layer immediately under the first signal wiring layer L3.

If two layers of a signal line are added for a low-speed signal, the signal line is provided in a sixth layer L6 and an eighth layer L8 as shown in the diagram and a seventh layer between them is a ground layer.

When FIG. 4 is compared with FIG. 2, because only one layer is considered as the signal wiring layer L6 for a low-speed signal, the number of ground layers is larger by at least one in FIG. 4 and correspondingly reduction in the thickness is inhibited.

The present embodiment also provides the same advantageous effects as those of the first embodiment.

As the same advantageous effects of the four-layer wiring unit as those of the first embodiment, if the requirement of the signal line arrangement is satisfied, crosstalk between signals is suppressed although the number of layers is the minimum, i.e. four, and signal line layers are allocated to two layers.

Furthermore, even when plural semiconductor integrated circuits simultaneously perform wiring potential transition (signal switch), such as output, noise is rapidly removed and the desired characteristics are obtained because the impedance of the power supply line and the ground line is low. Moreover, two signal line layers are provided and are outer layers on the mounting surface side. Thus, high-speed signal lines can be mounted at high density. As a result, it becomes possible to realize the following excellent small laminated wiring board. Specifically, this laminated wiring board has the minimum four-layer structure and small thickness. In addition, it allows reduction in the area of the laminated wiring board and does not inhibit the high-speed performance of the LSI.

In addition to these advantageous effects, the ground layer L5 and the third signal wiring layer L6 are further stacked on the back surface side in the second embodiment. Therefore, when a lower-speed signal line needs to be disposed, the signal line can be additionally disposed, with reduced thickness and size kept, without disturbing the arrangement of the high-speed signal line.

In the above-described first and second embodiments, the above-described effects of noise suppression and characteristic improvement are easily obtained when the data driving frequency is 10 to 200 MHz (at most 400 Mbps, in the bit rate). Furthermore, the above-described effects of noise suppression and characteristic improvement are easily obtained when the address driving frequency is 10 to 100 MHz (at most 200 Mbps, in the bit rate). Therefore, it is desirable to apply the present technique to a device that performs high-speed data transfer, such as a DDR-SDRAM.

<3. Third Embodiment>

[Circuit Block]

In the present embodiment, application of the above-described first or second embodiment to a specific device and specific arrangement of signal lines, particularly a requirement of the degree of overlap and so forth, will be defined in more detail.

FIG. 5 is a circuit block diagram of a memory module in which two DDR-SDRAMs (hereinafter, referred to simply as DDR memory) are aggregated together with a control IC such as a controller on one memory interposer board.

A memory module 3 shown in FIG. 5 has a first DDR memory 31, a second DDR memory 32, a memory controller 33, and another IC 34.

From the memory controller 33 to each of the first DDR memory 31 and the second DDR memory 32, a clock signal (CLK), a data signal (DQ), a data strobe signal (DQS), an address signal (ADDR), and a command (CMD) are output. Furthermore, from the memory controller 33 to another IC 34, a low-speed control signal (SIG) whose speed (driving frequency) is lower than that of the clock signal (CLK), the data signal (DQ), and the data strobe signal (DQS) is output.

In the present embodiment, another IC 34 to input the low-speed control signal (SIG) may be omitted. If another IC 34 is omitted, the structure of the laminated wiring board relating to the first embodiment shown in FIG. 1 can be employed. If the memory module has another IC 34 as shown in FIG. 5, the structure of the laminated wiring board relating to the second embodiment shown in FIG. 3 can be employed.

[Rule of Superposition of High-speed Signal Wiring]

Specific rules of superposition of signal lines will be described below by taking various kinds of signal lines shown in FIG. 5 as an example.

The clock signal (CLK), the address signal (ADDR), and the command (CMD) shown in FIG. 5 are allocated to the second signal wiring layer L1 as the uppermost layer shown in FIG. 3. Furthermore, the data signal (DQ) and the data strobe signal (DQS) shown in FIG. 5 are allocated to the first signal wiring layer L2 as the second top layer shown in FIG. 3.

FIGS. 6 to 10 show examples of the signal line combination for preventing overlap or suppressing overlap as much as possible. These diagrams schematically show the positional relationship of wiring only for a place where signal lines are disposed in parallel in upper and lower layers. As is apparent from FIG. 5, the wiring distance can be minimized if many signal lines are disposed as parallel lines on the side of the output from the memory controller 33 and the side of the input to the first DDR memory 31 and the second DDR memory 32. Therefore, suppressing the capacitive and inductive coupling between signal lines as much as possible at a place where wiring is disposed as parallel lines is effective to prevent the lowering of the characteristics of the whole board.

Figure 6:
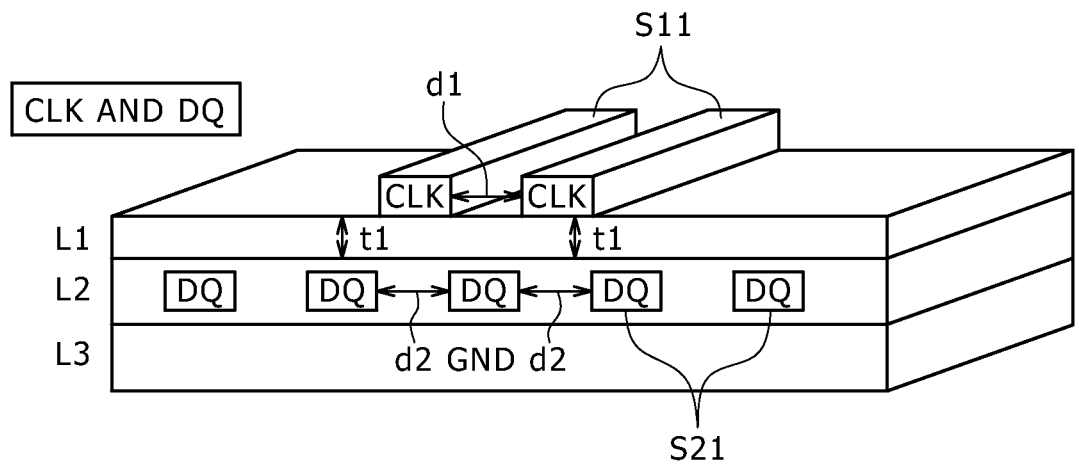
FIG. 6 is a schematic perspective view showing an example of the signal line combination for preventing overlap or suppressing overlap as much as possible.

FIG. 6 shows a wiring place where clock signal (CLK) lines S11 disposed on the second signal wiring layer L1 and data signal (DQ) lines S21 disposed in the first signal wiring layer L2 are readily coupled to each other vertically.

In the first signal wiring layer L2, the plural data signal (DQ) lines S21 are disposed at a constant interval of a separation distance d2. Furthermore, the clock signal (CLK) line S11 of the second signal wiring layer L1 is so disposed as to be opposed to the separation part of the data signal (DQ) line S21 with the intermediary of an insulating layer having a thickness t1. To satisfy the above-described requirement of the signal line arrangement that the clock signal (CLK) line S11 does not overlap with the data signal (DQ) line S21, it is desirable that the wiring width of the clock signal (CLK) line S11 is set equal to or smaller than the separation distance d2.

In the present disclosed techniques (first to third embodiments), the requirement of the signal line arrangement is essential but the requirement of the signal line width is not essential.

It is more desirable that the requirement of the signal line arrangement is satisfied and the requirement of the signal line width is also satisfied. In this desirable form, the data signal (DQ) lines S21 having a relatively small width should be separated from each other by a distance equal to or longer than the line width of the clock signal (CLK) line S11 having a relatively large width. Thus, the space width (separation width) of the data signal (DQ) line S21 is sufficiently larger than its line width (wiring width).

When signal lines are disposed with density that is as high as possible, it is permitted that part of the signal lines overlap with each other due to e.g. manufacturing variation although they do not overlap with each other in the design. The expression, "wiring does not overlap," in the present disclosure means that such slight overlap due to manufacturing variation is permitted.

In the above-described manner, the separation distance d2 and the wiring width of the data signal (DQ) line S21 and a separation distance d1 and the wiring width of the clock signal (CLK) line S11 are decided. Furthermore, although the data signal (DQ) line S21 on the lower layer side is strongly coupled to the ground layer L3 immediately under it, control of the coupling between the ground layer L3 and the clock signal (CLK) line S11 remoter from the ground layer L3 is important. Therefore, the thickness t1 of the upper-side insulating layer, in which a wiring layer does not need to be buried, is properly set.

If there is a margin of the characteristics, part of the signal lines may be intentionally overlapped with each other within the limit. The following description is based on the premise that at least the clock signal (CLK) line and the data signal (DQ) line do not overlap with each other.

Figure 7:
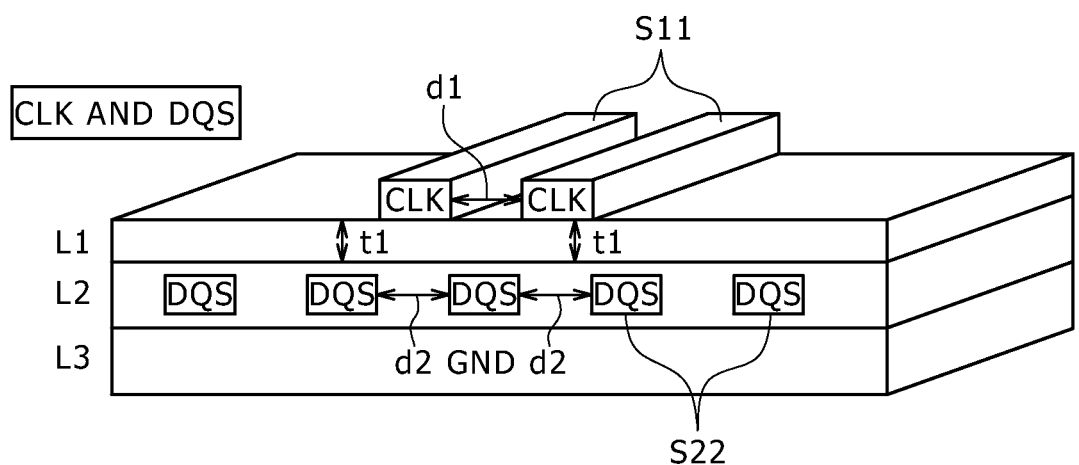
FIG. 7 is a schematic perspective view showing another example of the signal line combination for preventing overlap or suppressing overlap as much as possible.

FIG. 7 shows a wiring place where the clock signal (CLK) lines S11 disposed on the second signal wiring layer L1 and data strobe signal (DQS) lines S22 disposed in the first signal wiring layer L2 are readily coupled to each other vertically.

In the first signal wiring layer L2, the plural data strobe signal (DQS) lines S22 are disposed at a constant interval of the separation distance d2. Meanwhile, preferably the clock signal (CLK) lines S11 of the second signal wiring layer L1 have a wiring width equal to or smaller than the separation distance d2. In addition, the clock signal (CLK) line S11 of the second signal wiring layer L1 is so disposed as to be opposed to the separation part of the data strobe signal (DQS) line S22 with the intermediary of the insulating layer having the thickness t1. Due to this feature, preferably overlap of both lines of the clock signal (CLK) and the data strobe signal (DQS) is avoided. However, partial overlap occurs in some cases because the overlap prevention of FIG. 6 is given priority. Also in this case, it is important to suppress the overlap as much as possible.

To satisfy the above-described requirements, the separation distance d2 and the wiring width of the data strobe signal (DQS) line S22 and the separation distance d1 and the wiring width of the clock signal (CLK) line S11 are decided. Furthermore, although the data strobe signal (DQS) line S22 on the lower layer side is strongly coupled to the ground layer L3 immediately under it, control of the coupling between the ground layer L3 and the clock signal (CLK) line S11 remoter from the ground layer L3 is important. Therefore, the thickness t1 of the upper-side insulating layer, in which a wiring layer does not need to be buried, is properly set.

Figure 8:
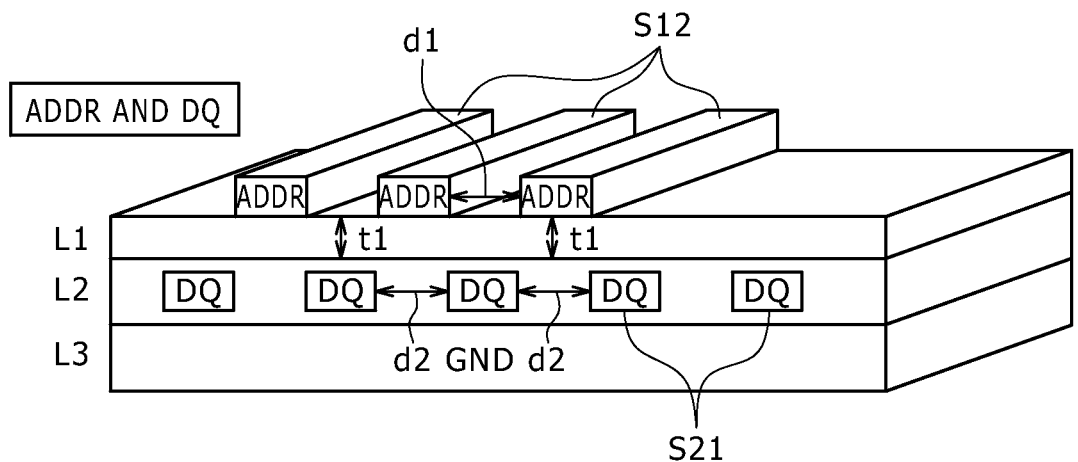
FIG. 8 is a schematic perspective view showing another example of the signal line combination for preventing overlap or suppressing overlap as much as possible.

FIG. 8 shows a wiring place where address signal (ADDR) lines S12 disposed on the second signal wiring layer L1 and the data signal (DQ) lines S21 disposed in the first signal wiring layer L2 are readily coupled to each other vertically.

In the first signal wiring layer L2, the plural data signal (DQ) lines S21 are disposed at a constant interval of the separation distance d2. Meanwhile, preferably the address signal (ADDR) lines S12 of the second signal wiring layer L1 have a wiring width equal to or smaller than the separation distance d2. In addition, the address signal (ADDR) line S12 of the second signal wiring layer L1 is so disposed as to be opposed to the separation part of the data signal (DQ) line S21 with the intermediary of the insulating layer having the thickness t1. Due to this feature, preferably overlap of both lines of the address signal (ADDR) and the data signal (DQ) is avoided. However, partial overlap occurs in many cases because the overlap prevention of FIG. 6 is given the first priority and the overlap prevention of FIG. 7 is given the second priority. Also in this case, it is important to suppress the overlap as much as possible.

To satisfy the above-described requirements, the separation distance d2 and the wiring width of the data signal (DQ) line S21 and the separation distance d1 and the wiring width of the address signal (ADDR) line S12 are decided. Furthermore, although the data signal (DQ) line S21 on the lower layer side is strongly coupled to the ground layer L3 immediately under it, control of the coupling between the ground layer L3 and the address signal (ADDR) line S12 remoter from the ground layer L3 is important. Therefore, the thickness t1 of the upper-side insulating layer, in which a wiring layer does not need to be buried, is properly set. Because the address signal (ADDR) is not a high-speed signal, this thickness t1 is so decided that the conditions of FIG. 6 and FIG. 7 are given the first and second priority, respectively.

Figure 9:
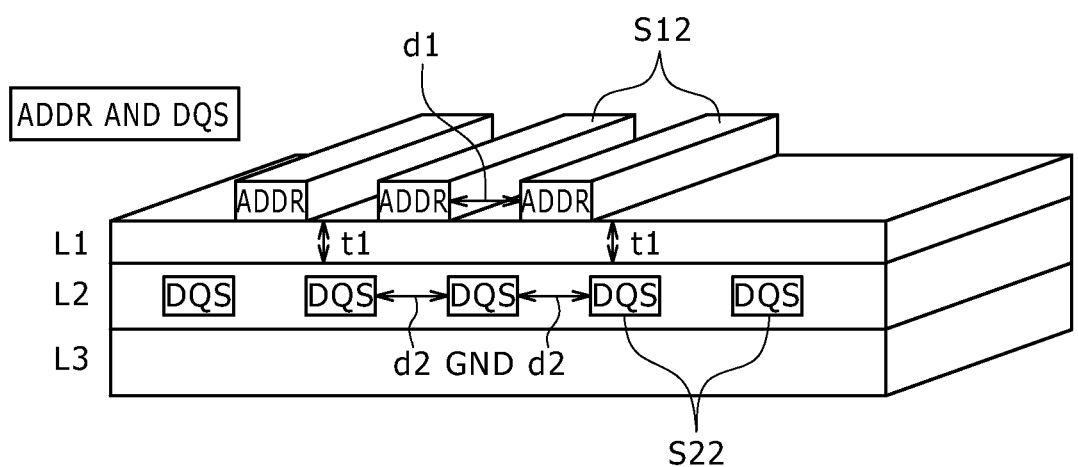
FIG. 9 is a schematic perspective view showing another example of the signal line combination for preventing overlap or suppressing overlap as much as possible.

FIG. 9 shows a wiring place where the address signal (ADDR) lines S12 disposed on the second signal wiring layer L1 and the data strobe signal (DQS) lines S22 disposed in the first signal wiring layer L2 are readily coupled to each other vertically.

In the first signal wiring layer L2, the plural data strobe signal (DQS) lines S22 are disposed at a constant interval of the separation distance d2. Meanwhile, preferably the address signal (ADDR) lines S12 of the second signal wiring layer L1 have a wiring width equal to or smaller than the separation distance d2. In addition, the address signal (ADDR) line S12 of the second signal wiring layer L1 is so disposed as to be opposed to the separation part of the data strobe signal (DQS) line S22 with the intermediary of the insulating layer having the thickness t1. Due to this feature, preferably overlap of both lines of the address signal (ADDR) and the data strobe signal (DQS) is avoided. However, the overlap prevention of FIG. 6 is given the first priority and the overlap prevention of FIG. 7 is given the second priority. Furthermore, the overlap prevention of FIG. 8 is given the third priority. Thus, partial overlap occurs in many cases. Also in this case, it is important to suppress the overlap as much as possible.

To satisfy the above-described requirements, the separation distance d2 and the wiring width of the data strobe signal (DQS) line S22 and the separation distance d1 and the wiring width of the address signal (ADDR) line S12 are decided. Furthermore, although the data strobe signal (DQS) line S22 on the lower layer side is strongly coupled to the ground layer L3 immediately under it, control of the coupling between the ground layer L3 and the address signal (ADDR) line S12 remoter from the ground layer L3 is important. Therefore, the thickness t1 of the upper-side insulating layer, in which a wiring layer does not need to be buried, is properly set. Because the address signal (ADDR) is not a high-speed signal, this thickness t1 is so decided that the conditions of FIG. 6, FIG. 7, and FIG. 8 are given the first, second, and third priority, respectively.

Figure 10:
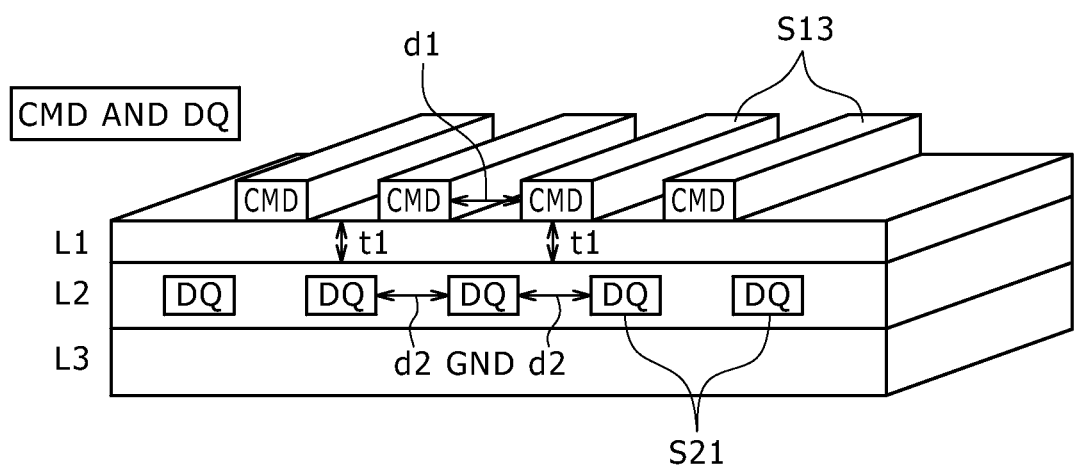
FIG. 10 is a schematic perspective view showing another example of the signal line combination for preventing overlap or suppressing overlap as much as possible.

FIG. 10 shows a wiring place where command (CMD) lines S13 disposed on the second signal wiring layer L1 and the data signal (DQ) lines S21 disposed in the first signal wiring layer L2 are readily coupled to each other vertically.

In the first signal wiring layer L2, the plural data signal (DQ) lines S21 are disposed at a constant interval of the separation distance d2. Meanwhile, preferably the command (CMD) lines S13 of the second signal wiring layer L1 have a wiring width equal to or smaller than the separation distance d2. In addition, the command (CMD) line S13 of the second signal wiring layer L1 is so disposed as to be opposed to the separation part of the data signal (DQ) line S21 with the intermediary of the insulating layer having the thickness t1. Due to this feature, preferably overlap of both lines of the command (CMD) and the data signal (DQ) is avoided. However, the overlap prevention of FIG. 6 is given the first priority and the overlap prevention of FIG. 7 is given the second priority. Furthermore, the overlap prevention of FIG. 8 is given the third priority and the overlap prevention of FIG. 9 is given the fourth priority. Thus, partial overlap occurs in many cases. Also in this case, it is important to suppress the overlap as much as possible.

To satisfy the above-described requirements, the separation distance d2 and the wiring width of the data signal (DQ) line S21 and the separation distance d1 and the wiring width of the command (CMD) line S13 are decided. Furthermore, although the data signal (DQ) line S21 on the lower layer side is strongly coupled to the ground layer L3 immediately under it, control of the coupling between the ground layer L3 and the command (CMD) line S13 remoter from the ground layer L3 is important. Therefore, the thickness t1 of the upper-side insulating layer, in which a wiring layer does not need to be buried, is properly set. Because the command (CMD) is not a high-speed signal, this thickness t1 is so decided that the conditions of FIG. 6, FIG. 7, FIG. 8, and FIG. 9 are given the first, second, third, and fourth priority, respectively.

As described above, in the present embodiment, specific examples of the above-described second embodiment are shown.

Furthermore, the specific wiring names and the best priority order to set the degree of overlap as low as possible are defined.

A description will be made below about a desirable range of the distance between wiring lines in the layer stacking direction.

Prior to this description, first the distance between wiring lines is defined as "interlayer thickness." For example, in FIG. 6, the thickness of the first signal wiring layer L2 can be set equal to that of the data signal (DQ) line S21. In this case, the thickness t1 of the insulating layer is the "interlayer thickness." On the other hand, if a thin insulating layer (thickness is a) exists between the data signal (DQ) line S21 and the insulating layer having the thickness t1 as shown in FIG. 6, (t1+α) is the interlayer thickness. This definition similarly applies also to FIGS. 7 to 10, with the signal line names accordingly replaced.

In FIGS. 6 to 10, an insulating layer (not shown) exists between the ground layer L3 and the first signal wiring layer L2. The "interlayer thickness" between the ground layer L3 and the first signal wiring layer L2 also refers to the distance from the electrically-conductive layer surface of the ground layer L3 to the lower surface of the signal line (e.g. data signal (DQ) line S21 in FIG. 6) similarly, irrespective of whether or not a thin insulating layer further intervenes.

The desirable range of the distance between wiring lines in the layer stacking direction changes depending on the driving frequency of the clock signal or the data signal (hereinafter, data driving frequency). In addition, particularly in the case of FIG. 8 and FIG. 9, the desirable range of the distance between wiring lines in the layer stacking direction changes depending on the address driving frequency.

Here, it is assumed that the data driving frequency is 10 to 200 MHz (at most 400 Mbps, in the bit rate). Furthermore, it is assumed that the address driving frequency is 10 to 100 MHz (at most 200 Mbps, in the bit rate).

Under the condition of these frequencies, distance of 65 to 100 μm is desirable as the distance from the uppermost surface of the electrically-conductive layer of the ground layer L3 kept at the ground potential to the lower surface of the data signal (DQ) line S21 or the data strobe signal (DQS) line S22 in the first signal wiring layer L2. In other words, a thickness of 65 to 100 μm is desirable as the interlayer thickness from the ground layer L3 to the first signal wiring layer L2.

Furthermore, under the above-described condition of the frequencies, distance of 150 to 190 μm is desirable as the distance from the uppermost surface of the electrically-conductive layer of the ground layer L3 kept at the ground potential to the lower surface of the clock signal (CLK) line, the address signal (ADDR) line, or the command (CMD) line on the second signal wiring layer L1. The distance in this case depends on the interlayer thickness from the ground layer L3 to the first signal wiring layer L2 and the wiring thickness of the first signal wiring layer L2. The lower limit of this range (150 μm) is equivalent to the distance when 65 μm is set as each of the interlayer thickness from the ground layer L3 to the first signal wiring layer L2 and the interlayer thickness between the first and second signal wiring layers L2 and L1 and the wiring thickness of the first signal wiring layer L2 is set to 20 μm. The upper limit of this range (190 μm) is obtained by setting each interlayer thickness larger than 65 μm and setting the wiring thickness of the first signal wiring layer L2 larger than 20 μm.

The priority order of application of the conditions of FIGS. 6 to 10 will be described below.

In the above description, it is essential that the condition of FIG. 6 is given the first priority and the condition of FIG. 7 is given the second priority. However, the priority order of the conditions of FIG. 8 and FIG. 9 may be reversed. The condition of FIG. 10 is given the lowest priority.

This is the way of deciding the priority order for a DDR-SDRAM as an example. However, as wiring whose overlap with the signal line having the highest driving frequency, e.g. the clock signal (CLK) line, is prevented as much as possible, wiring that has a high driving frequency and readily involves jitter variation is given priority. If wiring having the same driving frequency exists, the data line from which the data signal is finally output is given priority to keep the quality of the data signal high.

The above description is made about a microstrip structure in which two signal wiring layers are disposed for a single ground layer. However, it is also possible to change the structure to a strip structure obtained by, in the structure of FIG. 1, adding another ground layer L0 on the upper surface side of the second signal wiring layer L1, i.e. on the opposite side to the first signal wiring layer L2, to sandwich two signal wiring layers by the ground layers L0 and L3. In this case, an element-mounting wiring layer may be provided on the upper side of the ground layer L0 or on the lower side of the power supply layer L4 for example with the intermediary of an insulating layer.

Similarly, a strip structure may be formed by, in the structure of FIG. 3, adding another ground layer L0 on the upper surface side of the second signal wiring layer L1, i.e. on the opposite side to the first signal wiring layer L2. The side of the third signal wiring layer L6 may be as shown in FIG. 3. Alternatively, a ground layer L7 may be further added on the lower side of the third signal wiring layer L6 with the intermediary of an insulating layer.

According to the present embodiment, high-density mounting of wiring is carried out in such a manner that wiring overlap is suppressed as much as possible in accordance with such a basis. Thus, allocation of wiring including a high-speed signal line is possible with the minimum necessary board area and a small number of layers.

This can prevent a problem that simultaneous switching noise (SSO) due to simultaneous driving of plural high-speed ICs is superimposed on the power supply and the ground and jitter occurs in a high-speed signal via these common layers in a high-speed IF LSI module such as a DDR memory interface board, and can suppress crosstalk between high-speed signal lines.

Furthermore, cost compression can be achieved by reducing the number of board layers. Moreover, cost compression can be achieved by reducing the board size through enhancement in the wiring density.

The present disclosure contains subject matter related to that disclosed in Japanese Priority Patent Application JP 2011-023723 filed in the Japan Patent Office on Feb. 7, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laminated wiring board comprising a plurality of wiring layers configured to be stacked with intermediary of an insulating layer between the plurality of wiring layers and have a four-layer wiring unit obtained by disposing a power supply layer to which a power supply voltage is supplied, a first ground layer to which a ground potential is supplied, a first signal wiring layer, and a second signal wiring layer sequentially from one side of a layer stacking direction to the other side of the layer stacking direction with intermediary of the insulating layer between the layers of the four-layer wiring unit, wherein one of the first signal wiring layer and the second signal wiring layer includes a data signal line and the other of the first signal wiring layer and the second signal wiring layer includes a clock signal line, and the data signal line and the clock signal line are so disposed as to be prevented from overlapping with each other in a view perpendicular to the layer stacking direction at least at a place where both the data signal line and the clock signal line are disposed as parallel lines; wherein a first insulating layer, a second ground layer, a second insulating layer, and a third signal wiring layer are disposed on an opposite side to the first ground layer of the power supply layer sequentially from a side closer to the power supply layer.

2. The laminated wiring board according to claim 1, wherein signal wiring width of the second signal wiring layer relatively remote from the first ground layer is larger than signal wiring width of the first signal wiring layer relatively close to the first ground layer.

3. The laminated wiring board according to claim 1, wherein signal wiring width of the third signal wiring layer is larger than the signal wiring width of the first signal wiring layer.

4. The laminated wiring board according to claim 1, wherein the laminated wiring board is a memory interface board in which total at least three integrated circuits composed of at least one memory, a memory controller, and another circuit are mounted on a surface of the second signal wiring layer, and the third signal wiring layer includes a signal line of the another circuit.

5. The laminated wiring board according to claim 1, wherein the laminated wiring board is a memory interface board in which total at least two integrated circuits composed of at least one memory and a memory controller are mounted on a surface of the second signal wiring layer.

6. A laminated wiring board comprising:
a plurality of wiring layers configured to be stacked with intermediary of an insulating layer between the plurality of wiring layers and have a four-layer wiring unit obtained by disposing a power supply layer to which a power supply voltage is supplied, a ground layer to which a ground potential is supplied, a first signal wiring layer, and a second signal wiring layer sequentially from one side of a layer stacking direction to the other side of the layer stacking direction with intermediary of the insulating layer between the layers of the four-layer wiring unit,
wherein one of the first signal wiring layer and the second signal wiring layer includes a data signal line and the other of the first signal wiring layer and the second signal wiring layer includes a clock signal line, and
the data signal line and the clock signal line are so disposed as to be prevented from overlapping with each other in a view perpendicular to the layer stacking direction at least at a place where both the data signal line and the clock signal line are disposed as parallel lines, wherein the laminated wiring board is a memory interface board in which total at least two integrated circuits composed of at least one memory and a memory controller are mounted on a surface of the second signal wiring layer, wherein an integrated circuit of the at least one memory is a double data rate synchronous DRAM (DDR-SDRAM), the first signal wiring layer includes a line of each of a data signal and a data strobe signal of the DDR-SDRAM, the second signal wiring layer includes a line of each of a clock signal, an address signal, and a command of the DDR-SDRAM, and the line of at least one of the data signal and the data strobe signal and the line of the clock signal do not overlap with each other in the view perpendicular to the layer stacking direction at a place where the lines are parallel to each other.

7. The laminated wiring board according to claim 6, wherein for a first line pair of the line of at least one of the data signal and the data strobe signal and the line of the clock signal, and a second line pair of the line of the data signal and the line of the command, overlap of at least part of width of two lines in the pair in the view perpendicular to the layer stacking direction at a place where the lines are parallel to each other is permitted, and a degree of overlap of the lines in the second line pair is higher than a degree of overlap of the lines in the first line pair.

* * * * *